(12) United States Patent
Hattori et al.

(10) Patent No.: US 8,618,527 B2
(45) Date of Patent: Dec. 31, 2013

(54) MEMORY ELEMENT AND MEMORY DEVICE

(75) Inventors: Shinnosuke Hattori, Tokyo (JP);
Toshiyuki Kunikiyo, Kanagawa (JP);
Mitsunori Nakamoto, Tokyo (JP);
Shuichiro Yasuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 197 days.

(21) Appl. No.: 13/227,870

(22) Filed: Sep. 8, 2011

(65) Prior Publication Data

US 2012/0068146 A1  Mar. 22, 2012

(30) Foreign Application Priority Data

Sep. 16, 2010 (JP) ................. P2010-208466

(51) Int. Cl.
*H01L 29/06* (2006.01)

(52) U.S. Cl.
USPC .................................... 257/5; 257/2

(58) Field of Classification Search
CPC ....................................... H01L 45/14
USPC ........... 257/3, 5, E47.001, E21.622, 2
See application file for complete search history.

(56) References Cited

U.S. PATENT DOCUMENTS 7,227,169 B2 * 6/2007 Kozicki .......................... 257/2
2010/0291748 A1 * 11/2010 Dressler et al. ............... 438/384

FOREIGN PATENT DOCUMENTS

| JP | 2009-043757 | 2/2009 |
| JP | 2009-164467 | 7/2009 |

OTHER PUBLICATIONS

Z. Wei et al.; Highly Reliable TaOx ReRAM and Direct Evidence of Redox Reaction Mechanism; Electron Device Meeting; 2008; IEDM 2008; IEEE International.
Rainer Waser et al.; Redox-Based Resistive Switching Memories—Nanoionic Mechanisms, Prospects, and Challenges; Advanced materials 21; 2009; 2632-2663.

* cited by examiner

*Primary Examiner* — Yu-Hsi D Sun
(74) *Attorney, Agent, or Firm* — Dentons US LLP

(57) ABSTRACT

There are provided a memory element and a memory device with a smaller range of element-to-element variation of electrical characteristics. The memory element includes a first electrode, a memory layer, and a second layer in this order. The memory layer includes a resistance change layer including a plurality of layers varying in diffusion coefficient of mobile atoms, and an ion source layer disposed between the resistance change layer and the second electrode.

8 Claims, 6 Drawing Sheets

MEMORY ELEMENT AND MEMORY DEVICE

BACKGROUND

The present disclosure relates to a memory element storing information based on any change of electrical characteristics observed in a memory layer including an ion source layer and a resistance change layer, and to a memory device.

A semiconductor nonvolatile memory popularly used for data storage has been a NOR or NAND flash memory. Such a semiconductor nonvolatile memory, however, has been pointed out that there are limitations on microfabrication considering the need for a high level of voltage for writing and erasing, and the limited number of electrons for injection to a floating gate.

For overcoming such limitations on microfabrication, a next-generation nonvolatile memory currently proposed is a resistance change memory such as ReRAM (Resistance Random Access Memory) or PRAM (Phase-Change Random Access Memory) (for example, see Japanese Unexamined Patent Application Publication No. 2009-164467). These memories are each in the simple configuration including a resistance change layer between two electrodes. In a memory of Japanese Unexamined Patent Application Publication No. 2009-43757, as an alternative to the resistance change layer, an ion source layer and an oxide film (thin film for storage) are provided between first and second electrodes.

The principles of resistance change in these resistance change memories are deemed to be based on the formation of a conductive path inside of the resistance change layer as a result of the movement of atoms or ions from the ion source layer to the resistance change layer by heat or an electric field, but the details thereof are not yet made clear. The currently leading theory is that the resistance value changes by the micro-migration of ions with oxidation reduction (for example, see Wei, Z. Kanazawa, et al. Electron Device Meeting, 2008. IEDM 2008. IEEE International). Moreover, with a resistance change memory element in which mobile ions are copper (Cu) in GeSe, a phenomenon of randomly-changing resistance is observed. There is a report about such a change of resistance, which is due to the thermal migration of mobile ions in a portion serving as a conductive path (for example, see Rainer Waser, et al. Advanced Materials 21, no. 25-26 (2009): 2632-2663).

The issue here is that the recent memory device is expected to be small in size and large in capacity. In order to meet such expectations, the capacity increase is aimed to be achieved by integration of a plurality of memory elements on a single chip.

SUMMARY

However, the previous resistance change memory (memory element) each has its own electrical characteristics. If any of a plurality of memory elements on a chip largely differs in the electrical characteristics, the resulting chip becomes defective as is not falling within the operation margin. As such, with the chip carrying thereon a plurality of memory elements, the varying electronic characteristics of the memory elements greatly affect the characteristics of the chip, thereby disadvantageously reducing the chip yield.

It is thus desirable to provide a memory element and a memory device with a smaller range of element-to-element variation of electrical characteristics.

A memory element according to an embodiment of the present disclosure includes a first electrode, a memory layer, and a second electrode in this order. The memory layer includes a resistance change layer, and an ion source layer. The resistance change layer includes a plurality of layers varying in diffusion coefficient of mobile atoms, and the ion source layer is disposed between the resistance change layer and the second electrode. To be specific, the resistance change layer includes a first layer on the first electrode side, and a second layer between the first layer and the ion source layer. In the first layer, the diffusion coefficient of mobile atoms at the room temperature is $1.0 \times 10^{-21}$ $m^2/s$ or smaller.

A memory device according to an embodiment of the present disclosure includes a plurality of memory elements each including a first electrode, a memory layer, and a second electrode in this order, and a pulse application section applying a voltage or current pulse selectively to the memory elements. In the memory device, the memory elements are those according to the embodiment of the present disclosure.

With the memory element (memory device) according to the embodiment of the present disclosure, when a voltage or current pulse of "positive direction" (e.g., the first electrode side is at a negative potential, and the second electrode side is at a positive potential) with respect to the element in the initial state (high-resistance state), any metallic element contained in the ion source layer is ionized and diffused in the resistance change layer, and then is deposited by bonding with electrons at the first electrode, or remains in the resistance change layer and forms an impurity level. As a result, a low-resistance section (conductive path) containing the metallic element is formed in the memory layer, thereby decreasing the resistance of the resistance change layer (state of recording). When a voltage pulse of "negative direction" (e.g., the first electrode side is at a positive potential, and the second electrode side is at a negative potential) is applied with respect to the element in the low-resistance state as such, the metallic element that has been deposited on the first electrode is ionized, and then is dissolved into the ion source layer. As a result, the conductive path made of the metallic element disappears, and the resistance change layer is increased in resistance (initial state or state of erasing).

Herein, the resistance change layer is configured by a plurality of layers varying in diffusion coefficient of mobile atoms, thereby favorably preventing any possible generation of an electron localized site(s) in the resistance change layer after erasing.

With the memory element or the memory device according to the embodiment of the present disclosure, the resistance change layer is configured by a plurality of layers varying in diffusion coefficient of mobile atoms, thereby favorably preventing any possible generation of an electron localized site(s) in the resistance change layer after erasing. This accordingly reduces the range of element-to-element variation of the electronic characteristics.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION OF THE PREFERRED EMBODIMENT

In the below, by referring to the accompanying drawings, an embodiment of the present disclosure is described in the following order.

Embodiment

1. Memory Element (Memory Element with Resistance Change Layer in Two-Layer Structure)
2. Memory Device First Embodiment (Memory Element)

Figure 1:
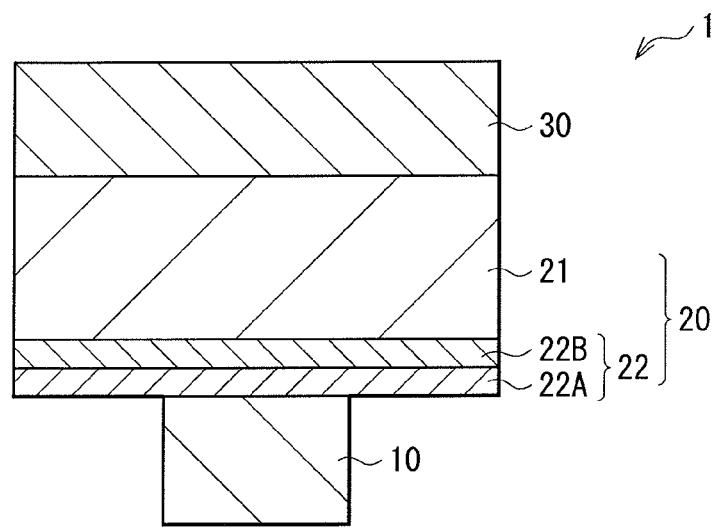
FIG. 1 is a cross-sectional view of a memory element in an embodiment of the present disclosure, showing the configuration thereof.

FIG. 1 is a cross-sectional view of a memory element 1 in an embodiment of the present disclosure, showing the configuration thereof. This memory element 1 is configured to include a lower electrode 10 (first electrode), a memory layer 20, and an upper electrode 30 (second electrode) in this order.

The lower electrode 10 is provided on a silicon substrate 41 formed with a CMOS (Complementary Metal Oxide Semiconductor) circuit as will be described later (FIG. 2), for example, thereby serving as a connection section with the portion of the CMOS circuit. This lower electrode 10 is made of a material for wiring use in the semiconductor process, e.g., tungsten (W), tungsten nitride (WN), copper (Cu), aluminum (Al), molybdenum (Mo), tantalum (Ta), and silicide. When the lower electrode 10 is made of a material such as Cu that possibly causes ion conduction in an electric field, the surface of the lower electrode 10 made of Cu or others as such may be covered with a material that hardly causes ion conduction or thermal diffusion, e.g., W, WN, titanium nitride (TiN), and tantalum nitride (TaN). When an ion source layer 21 that will be described later contains Al, preferably used is a metal film containing one or more of chromium (Cr), W, cobalt (Co), silicon (Si), gold (Au), palladium (Pd), Mo, iridium (Ir), titanium (Ti), and others that are more resistant to ionization than Al, or an oxide or nitride film thereof.

The memory layer 20 is configured by the ion source layer 21, and a resistance change layer 22. The ion source layer 21 contains an element (mobile atoms) to be converted into mobile ions (cations and anions) that diffuse to the resistance change layer 22. The element that is possibly cationized includes one or two or more of metallic elements such as Cu, Al, silver (Ag), zinc (Zn), and germanium (Ge). As an ion conductive material that is to be anionized includes at least one or more of chalcogen elements including oxygen (O) or tellurium (Te), sulfur (S) and selenium (Se), for example. The ion source layer 21 is disposed on the upper electrode 30 side, and in this example, is in contact with the upper electrode 30. The metallic element(s) and the chalcogen element(s) are bonded together, thereby forming a metal chalcogenide layer. This metal chalcogenide layer is mainly in the amorphous structure, and serves as an ion supply source.

As for the metallic element that is possibly cationized, as is reduced on the cathode electrode during the operation of writing and forms a conductive path (filament) in the form of metal, any element chemically stable is preferable, i.e., remains in the form of metal in the ion source layer 21 containing the chalcogen element(s) described above. Such a metallic element includes, other than those described above, transition metals of groups 4A, 5A, and 6A in the periodic table, i.e., Ti, zirconium (Zr), hafnium (Hf), vanadium (V), niobium (Nb), Ta, Cr, Mo, and W, for example. Among these elements, one or two or more are possibly used. Alternatively, Si or others may be used as additive elements to the ion source layer 21.

Moreover, using any metallic element (M) that is more likely to react with the chalcogen element such as Te in the resistance change layer 22 that will be described later, the ion source layer 21 may be in the layered structure of Chalcogen Element/Ion Source Layer (containing the metallic element M). If this is the configuration, with a heat treatment after the film formation, the resulting structure is stabilized as MTe/Ion Source Layer 21. The material more likely to react with the chalcogen element is exemplified by Al, magnesium (Mg), and others.

The specific material of the ion source layer 21 as such contains ZrTeAl, TiTeAl, CrTeAl, WTeAl, TaTeAl, and others. Such specific materials may also include CuZrTeAl being a result of addition of Cu to ZrTeAl, CuZrTeAlGe being a result of addition of Ge to CuZrTeAl, and CuZrTeAlSiGe being a result of addition of another additive element to CuZrTeAlGe. Another option is ZrTeMg including Mg as an alternative to Al. As for the ionizing metallic element, any similar additive element is possibly used even if a transition metallic element selected for use is not Zr but Ti or Ta, e.g., possibly TaTeAlGe. Moreover, as for the ion conductive material, Te is surely not restrictive, and sulfur (S), selenium (Se), or iodine (I) may be also used, i.e., specifically ZrSAl, ZrSeAl, ZrIAl, CuGeTeAl, and others. Note that exemplified herein is the compound including Te, but this is surely not restrictive, and the compound may also contain any chalcogen element other than Te. Furthermore, Al is not necessarily contained, and CuGeTeZr or others may be also used.

Note that the ion source layer 21 may be added with any other elements for the purpose of preventing peeling of film during a high-temperature heat treatment for the memory layer 20, for example. Silicon (Si) is an exemplary additive element that possibly offers also the improvement of retention characteristics, and is preferably added to the ion source layer 21 together with Zr. Herein, if the content of Si for addition is not enough, the effect of preventing the film peeling is not sufficiently produced, and if the content thereof is too much, the resulting memory operation characteristics are not satisfactory enough. In consideration thereof, the content of Si in the ion source layer 21 is preferably in the range of about 10 to 45 atomic %.

The resistance change layer 22 is disposed on the lower electrode 10 side. This resistance change layer 22 serves as a barrier against electric conduction, and when a predetermined level of voltage is applied between the lower and upper electrodes 10 and 30, the resistance value thereof shows a change. In this embodiment, this resistance change layer 22 is in the structure of a plurality of layers, e.g., in the structure of two layers including first and second layers 22A and 22B. The first layer 22A and the second layer 22B are provided to be in contact with the lower electrode 10 and the ion source layer 21, respectively.

The resistance change layer 22, that is, the first and second layers 22A and 22B are both made of an oxide material or a compound mainly containing a chalcogen element that behaves as an anionic component, e.g., S, Se, or Te. Such a compound is exemplified by AlTe, MgTe, or ZnTe. As for the composition of the compound containing Te as such, e.g., AlTe, the content of Al is preferably 20 atomic % or higher but 60 atomic % or lower due to reasons that will be described later. Especially, the first layer 22A preferably has the diffusion coefficient against mobile ions smaller than that of the second layer 22B. To be specific, the material for use preferably has the diffusion coefficient of $1.0 \times 10^{-21}$ m²/s or smaller at the room temperature. Note that this value of the diffusion coefficient is very small compared with the diffusion coefficient of any general metallic atoms for use in the resistance change layer 22. Such a small diffusion coefficient accordingly prevents the diffusion of mobile ions coming from the ion source layer 21. Such a material is specifically exemplified by, as an oxide material, $SiO_2$, $Al_2O_3$, NiO, PdO, MnO, FeO, CoO, CaO, MgO, GdO, ZnO, TiO, ZrO, HfO, TaO, WO, or LaO. Herein, the flow of diffusion of mobile ions is proportional to the gradient of a chemical potential, and when the layers in stack vary in chemical potential, the atoms in the vicinity of the interface move to the layer whose chemical potential is lower than the other. In consideration thereof, the second layer 22B is preferably made of a material with a diffusion coefficient larger than that of the first layer 22A, and with a chemical potential lower than that of the first layer 22A. Such a material is specifically exemplified by Al and Te. Alternatively, similarly to the first layer 22A, the material may include one or more of Si, nickel (Ni), Pd, manganese (Mn), iron (Fe), Co, calcium (Ca), magnesium (Mg), gadolinium (Gd), Zn, Zr, Hf, V, Nb, Ta, Cr, Mo, W, and lanthanum (La), or may include a combination of O, Te, S, and Se. Such a material favorably prevents the diffusion of mobile ions from the ion source layer 21 after erasing, and facilitates the migration of the mobile ions to the ion source layer at the time of erasing.

Moreover, the resistance change layer 22 preferably has the initial resistance value of 1 MΩ or larger. Considering as such, the resistance value in the state of low resistance is preferably several hundred kΩ or smaller. For reading at a high speed the state of resistance of any microfabricated resistance change memory, the resistance value in the state of low resistance is preferably as low as possible. However, because the resistance value is 40 to 100 kΩ when writing is performed with the requirements of 20 to 50 µA and 2 V, the memory is supposed to have the initial resistance value higher than that value. Allowing for the one-digit width of resistance separation, the resistance value described above is considered appropriate.

The upper electrode 30 may be made of a material similar to that of the lower electrode 10, i.e., a well-known material for use of semiconductor wiring, and preferably, be made of a stable material not reacting with the ion source layer 21 even after post-annealing.

With such a memory element 1 of the embodiment, when a voltage or current pulse is applied by a power supply circuit (pulse application section; not shown) via the lower and upper electrodes 10 and 30, the memory layer 20 shows a change of the electrical characteristics, e.g., change of the resistance value, thereby performing information writing, erasing, and reading. In the below, such an operation is described specifically.

First of all, a positive voltage is applied to the memory element 1 such that the upper electrode 30 is at a positive potential, and the lower electrode 10 side is at a negative potential, for example. In response thereto, any metallic element in the ion source layer 21 is ionized and diffused to the resistance change layer 22, and then is deposited by bonding with electrons on the lower electrode 10 side. As a result, a conductive path (filament) is formed on the interface between the lower electrode 10 and the memory layer 20. This conductive path is made of a low-resistance metallic element reduced in the form of metal. Alternatively, the ionized metallic element remains in the resistance change layer 22, and forms an impurity level. As a result, the resistance change layer 22 is formed therein with a conductive path, and this accordingly decreases the resistance value of the memory layer 20, i.e., the memory layer 20 shows a decrease of resistance value to be lower (to be in the low-resistance state) than that in the initial state (in the high-resistance state).

Thereafter, even if the memory element 1 becomes free of voltage by stopping the application of the positive voltage, the state of low resistance is retained. This means information writing is done. For use in a once-writable memory device, i.e., a so-called PROM (Programmable Read Only Memory), the memory element 1 is completed with recording only by the process of recording described above. On the other hand, for application use in an erasable memory device, i.e., RAM (Random Access Memory), EEPROM (Electronically Erasable and Programmable Read Only Memory), or others, a process of erasing is necessary. During the process of erasing, a negative voltage is applied to the memory element 1 such that the upper electrode 30 is at a negative potential, and the lower electrode 10 side is at a positive potential, for example. In response thereto, in the conductive path formed inside of the memory layer 20, the metallic element is ionized, and then is dissolved into the ion source layer 21 or is bonded with Te or others, thereby forming a compound such as $Cu_2Te$ or CuTe. As a result, the conductive path made of the metallic element disappears or is decreased in area, and the resistance value thus shows an increase.

Thereafter, even if the memory element 1 becomes free of voltage by stopping the application of the negative voltage, the resistance value therein remains high. This allows erasing of any information written thereto. By repeating such a procedure, the memory element 1 is to be subjected to repeated writing of information and erasing of the written information.

If the state high in resistance value is correlated with information of "0", and if the state low in resistance value is correlated with information of "1", for example, the information of "0" is to be changed to the information of "1" in the process of information recording by the application of a positive voltage, and the information of "1" is to be changed to the information of "0" in the process of information erasing by the application of a negative voltage. Note that, in this example, although the operation of decreasing the resistance of the memory element is correlated with the writing operation and the operation of increasing the resistance thereof is correlated with the erasing operation, the correlation may be inversed.

For demodulation of any recorded data, the larger ratio is more preferable between an initial resistance value and an after-recording resistance value. However, a too large resistance value of the resistance change layer 22 causes a difficulty in writing, i.e., in decreasing the resistance. As a result, since a threshold voltage for writing is increased too much, the initial resistance value is preferably adjusted to be 1 GΩ or smaller. The resistance value of the resistance change layer 22 is possibly controlled by the thickness thereof or the content of anions therein, for example.

Due to the reasons as such, when the resistance change layer 22 (especially the second layer 22B) is made of a chalcogen element, Te is a preferable selection for use. This is because, during the decrease of resistance, the metallic element diffused from the ion source layer 21 is stabilized in the resistance change layer 22 so that the resulting low-resistance state becomes easy to retain. Moreover, compared with oxides high in electronegativity and silicon compounds being covalent compounds, the binding force of Te with the metallic element is weaker, and thus the metallic element diffused inside of the resistance change layer 22 is easily moved to the ion source layer 21 by the application of an erasing voltage so that the erasing characteristics are improved. Note that, as for the electronegativity of the chalcogenide compounds, since the absolute values of the chalcogen elements are in the ascending order of tellurium<selenium<sulfur<oxygen, the effect of improvement is to be high with the lower content of oxygen in the resistance change layer 22, and with the use of any chalcogenide compound low in electronegativity.

Moreover, in the embodiment, as described above, the ion source layer 21 preferably contains Ze, Al, Ge, and others. In the below, the reasons thereof are described.

When the ion source layer 21 contains Zr, this Zr acts as an ionizing element together with the metallic element such as Cu described above so that the resulting conductive path is a mixture of Zr and the above-described metallic element such as Cu. Herein, Zr seems to be reduced on the cathode electrode during the operation of writing, and seems to form a filament in the form of metal in the low-resistance state after the writing. The metal filament as a result of reduction of Zr is relatively difficult to dissolve in the ion source layer 21 containing the chalcogenide element(s) such as S, Se, and Te. Therefore, once the state is put in writing, i.e., in the low-resistance state, the resulting low-resistance state is retained more easily than in the case with a conductive path containing only the above-described metallic element such as Cu. For example, Cu is formed as a metal filament by the operation of writing. However, Cu in the form of metal is dissolved easily in the ion source layer 21 containing the chalcogenide element(s), and in the state of no application of a voltage pulse for writing, i.e., in the state of data retention, Cu is ionized again and the state is changed to high resistance. The resulting characteristics of data retention are not thus satisfactory. On the other hand, combining Zr with any appropriate content of Cu facilitates amorphization, and keeps uniform the microstructure of the ion source layer 21, thereby contributing to the improvement of the characteristics of resistance value retention.

Also for retention of the high-resistance state during erasing, when the ion source layer 21 contains Zr, a conductive path to be formed includes Zr, for example, and when Zr is dissolved in the ion source layer 21 again as ions, due to the lower ion mobility of Zr at least than Cu, the Zr ions are resistant to move even if the temperature is increased, or even if they are left as they are for a long time. As such, Zr in the form of metal is not easily deposited on the cathode electrode, and thus remains high in resistance even if it is kept in the temperature higher than the room temperature or if it is left as it is for a long time.

Moreover, when the ion source layer 21 contains Al, if the upper electrode is biased to a negative potential as a result of the erasing operation, the high-resistance state (erasing state) is stabilized by forming an oxide film stable on the interface between the ion source layer 21 behaving like a solid-electrolyte layer and the anode electrode. This also contributes to the increase of the repetition frequency considering the self-reproduction of the resistance change layer. Herein, Al is surely not the only option, and Ge or others acting similar thereto may be also used.

As such, when the ion source layer 21 contains Zr, Al, Ge, and others, compared with the previous memory element, the resulting memory element has the improved characteristics of wide-range resistance value retention and of high-speed operation of writing and erasing, and the increased repetition frequency. Moreover, if any resistance state intermediate between high and low is created through adjustment of an erasing voltage during a change of resistance from low to high, for example, the resulting intermediate state is to be retained with a good stability. Accordingly, the resulting memory is capable not only of binary storage but also of multilevel storage. Herein, such an intermediate state is possibly created also through adjustment of the amount of atoms for deposition by changing a write current during a change of resistance from high to low.

Such various characteristics important for the operation of memory, i.e., the characteristics of operation of writing and erasing with voltage application, the characteristics of resistance value retention, and the repetition frequency of operation, vary depending on the addition content of Zr, Cu, and Al, and also Ge.

If the content of Zr is too much, for example, the resulting ion source layer 21 is decreased too much in resistance value, thereby failing in voltage application effectively to the ion source layer 21, or resulting in a difficulty in dissolving Zr in the chalcogenide layer. This especially causes a difficulty in erasing, and the threshold voltage for erasing is increased based on the addition content of Zr. If the content of Zr is all too much, this results in a difficulty also in writing, i.e., decrease of resistance. On the other hand, if the addition content of Zr is too little, the effect of improving the characteristics of wide-range resistance value retention as described above is impaired. In consideration thereof, the content of Zr in the ion source layer 21 is preferably 7.5 or more, and more preferably, 26 atomic % or less.

Moreover, although adding an appropriate content of Cu to the ion source layer 21 indeed facilitates amorphization, if the content thereof is too much, Cu in the form of metal degrades the characteristics of writing retention or adversely affects the speed of the writing operation as is not stable enough in the ion source layer 21 containing the chalcogen element(s). Whereas a combination of Zr and Cu produces the effect of making amorphous the ion source layer 21 with ease, and of keeping uniform the microstructure of the ion source layer 21. This accordingly prevents the material components in the ion source layer 21 from becoming not uniform by the repeated operation, thereby increasing the repetition frequency and improving the retention characteristics. When the content of Zr in the ion source layer is enough in the above-described range, the conductive path of metal zirconium (Zr) is supposed to remain as it is even if the conductive path made of Cu is dissolved again into the ion source layer 21, and thus the characteristics of writing retention are not affected. Moreover, as for the preferable addition content of Cu, as long as cations and anions possibly being the results of dissociation and ionization are in the equivalent relationship of the amount of charge, the equivalence ratio of the charge of ions is supposed to fall within a range of {(Highest Valence of Zr Ions×Number of Moles or Atomic %)+(Valence of Cu Ions×Number of Moles or Atomic %)}/(Valence of Chalcogen Ions×Number of Moles or Atomic %)=0.5 to 1.5.

Note here that, virtually, the characteristics of the memory element 1 are dependent on the composition ratio between Zr and the chalcogen element such as Te, for example. Accordingly, the composition ratio between Zr and the chalcogen element preferably falls within the following range.

Composition Ratio of Zr (Atomic %)/Composition Ratio of Chalcogen Element (Atomic %)=0.2 to 0.74

This is not always evident, but since Cu has the degree of dissociation lower than that of Zr, and since the resistance value of the ion source layer 21 is determined by the composition ratio between Zr and the chalcogen element, as long as the composition ratio between Zr and chalcogen element falls within the above-described range, the resistance value remains suitable. This thus seems because the bias voltage applied to the memory element 1 works effectively to the portion of the resistance change layer 22.

When the value does not fall within the range described above, e.g., when the equivalence ratio is too large, the balance between the cations and anions is lost, and thus among the existing metallic elements, any element not ionizing is increased in amount. Therefore, the conductive path generated by the operation of writing during the operation of erasing may not be eliminated efficiently. Similarly, when the anion element exists too much because the equivalence ratio is too small, the conductive path in the form of metal generated by the operation of writing is not inclined to remain in the form of metal. The characteristics of writing state retention thus seem to be degraded.

When the content of Al is too much, the Al ions become easy to move, thereby creating the state of writing by reduction of the Al ions. Since Al is not stable enough in the form of metal in the chalcogenide solid electrolyte, the characteristics of low-resistance writing state retention are degraded. On the other hand, when the content of Al is too little, the effect of improving the erasing operation itself or the characteristics of high-resistance region retention is impaired, thereby decreasing the repetition frequency. In consideration thereof, the content of Al in the ion source layer 21 is preferably 30 atomic % or more, and more preferably, 50 atomic % or less.

Herein, Ge is not necessarily contained, but when Ge is to be added, the content thereof is preferably 15 atomic % or less considering that too much content of Ge degrades the characteristics of writing retention.

In the below, the manufacturing method of the memory element 1 in the embodiment is described.

First of all, on a substrate formed with a CMOS circuit such as selection transistor, the lower electrode 10 made of TiN or others are formed. Thereafter, if necessary, any oxides or others on the surface of the lower electrode 10 are removed by reverse sputtering, for example. Next, the formation of layers is performed up to the upper electrode 30 including the resistance change layer 22, i.e., the first and second layers 22A and 22B, and the ion source layer 21 in succession through exchange of targets in a device for sputtering. The targets herein are those each with the composition adapted for the material of the corresponding layer. The diameter of the electrode is 50 to 300 nmφ. A film of alloy is formed at the same time using a target of a component element.

After the formation of layers up to the upper electrode 30, a wiring layer (not shown) is formed for connection to the upper electrode 30, and a contact section is connected to achieve a common potential among all of the memory elements 1. Thereafter, the layered film is subjected to a post-annealing process. As such, the memory element 1 of FIG. 1 is completed.

Figures 4A, 4B:
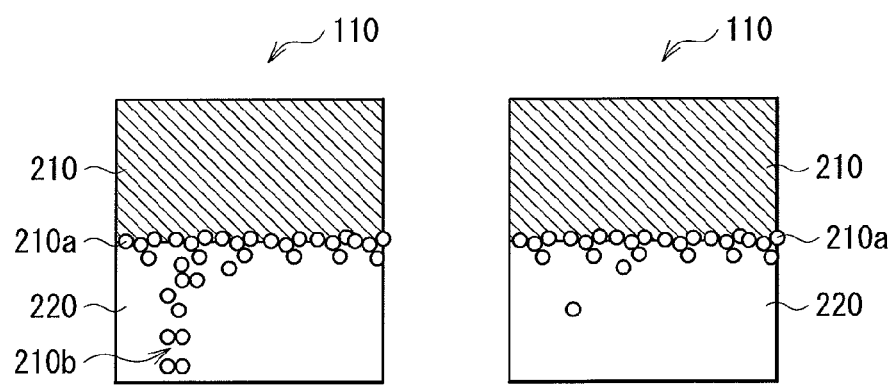
FIGS. 4A and 4B are each a schematic diagram for illustrating any resistance change in a resistance change layer.

FIGS. 4A and 4B are each a schematic diagram showing the principles of resistance change in a resistance change layer 220 in a memory element 110 as a comparative example. In this memory element 110, a voltage is applied to the upper and lower electrodes (not shown) to be at positive and negative potentials, respectively. In response thereto, as shown in FIG. 4A, mobile ions 210a are moved from the ion source layer 210 side into the resistance change layer 220, whereby a conductive path 210b is formed. This accordingly decreases the resistance value of the resistance change layer 220 so that writing is performed. Next, to each of the upper and lower electrodes, applied this time is a voltage whose polarity is opposite to that applied thereto for writing. In response thereto, the metallic element in the conductive path 210b is ionized again, and as shown in FIG. 4B, then is moved onto the interface between the resistance change layer 220 and the ion source layer 210. This accordingly increases the resistance value of the resistance change layer 220 so that erasing is performed.

Figure 5A:
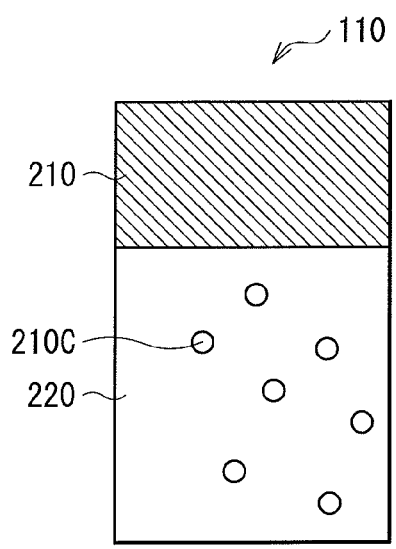
FIGS. 5A and 5B are each a schematic diagram showing the distribution of mobile ions in a previous memory element, and that in the memory element of FIG. 1.
Figure 5B:
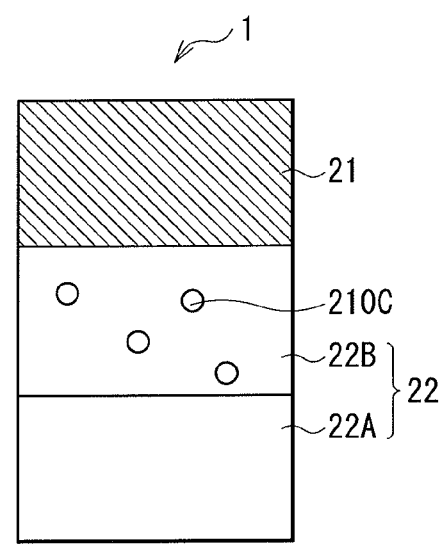

However, in the memory element 110 after erasing, as shown in FIG. 5A, the metallic element that has reached the interface between the resistance change layer 220 and the ion source layer 210 starts gradually diffusing into the whole resistance change layer 220. As a result, the resistance change layer 220 is formed therein with electron localized sites 210c resulted from the mobile ions 210a. These electron localized sites 210c are the structure of electrons resulted from the mobile ions 210a left remained at the time of erasing, or any portion where the composition is non-homogeneous inside of the resistance change layer 220 such as defects and grain boundaries. The electron localized sites 210c as such are deemed as a cause of element-to-element variation of resistance. To be specific, when the resistance change layer 220 includes any electron localized sites 210c, these electron localized sites 210c act as an impurity in a so-called insulator. This is deemed to be a cause of the flow of a hopping current between the electron localized sites 210c, or the reduction of resistance because the electron localized sites 210c serving as a current path such as band conduction. Moreover, the electron localized sites 210c are formed in the whole resistance change layer 220, and thus such a change of resistance as described above is greatly influenced by the number of the electron localized sites 210c. Therefore, with the previous memory element, the resistance value varies among the elements, thereby resulting in a disadvantage of reducing the chip yield.

On the other hand, with the memory element 1 in the embodiment, the resistance change layer 22 is in the two-layer structure including the first and second layers 22A and 22B, which are made of materials with different diffusion coefficients. Moreover, in the first layer 22A on the lower electrode 10 side, the mobile stoms have the smaller diffusion coefficient at the room temperature, i.e., $1.0 \times 1^{-21}$ m$^2$/s or smaller. Accordingly, even if the mobile ions are diffused from the ion source layer 21 to the second layer 22B in the resistance change layer 22 after erasing, the diffusion thereof into the first layer 22A is prevented. In other words, the whole resistance change layer 22 is prevented from being formed therein with the electron localized sites 210c.

Figure 6A:
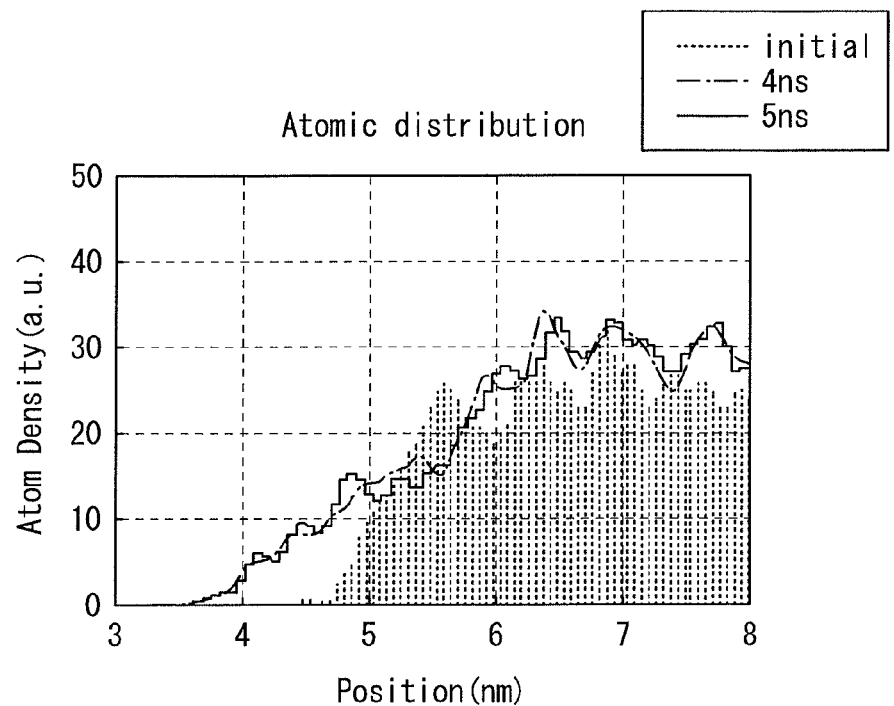
FIGS. 6A and 6B are each a characteristics diagram showing the position-based distribution of mobile ions in the previous memory element, and that in the memory element of FIG. 1.
Figure 6B:
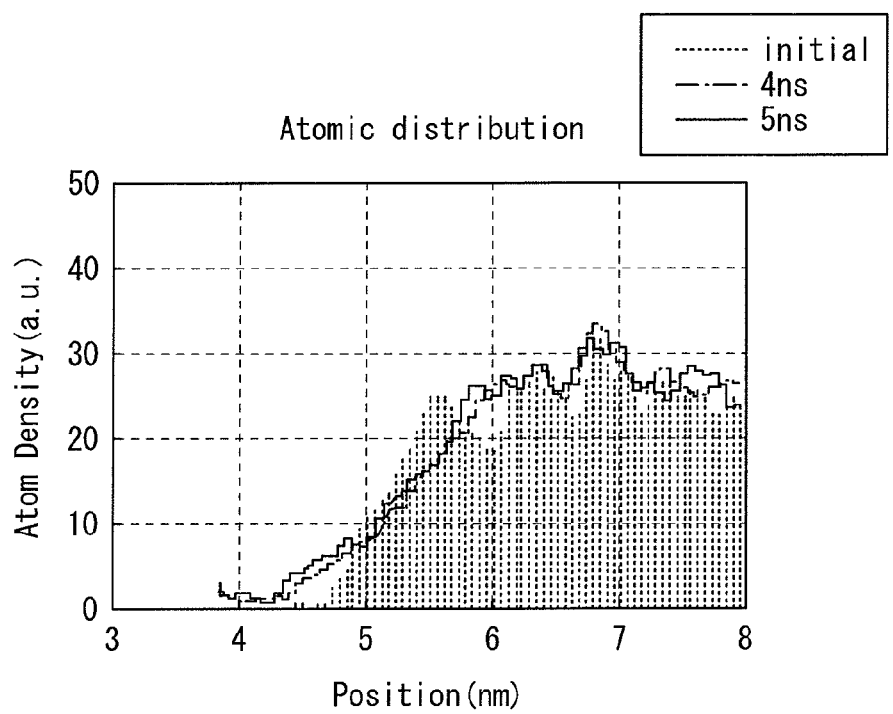

FIGS. 6A and 6B each show the measurement result of a density distribution of mobile ions in a memory element by a simulation of molecular dynamics, specifically FIG. 6A shows that in the memory element 110 in which a resistance change layer is in the one-layer structure, and FIG. 6B shows that in the memory element 1 in the embodiment. In this example, the ion source layers 210 and 21 are each made of an oxide containing mobile ions, and the resistance change layer 220 in the memory element 110 is made of a material with a high diffusion coefficient. In the resistance change layer 22 in the memory element 1, the first layer is made of $SiO_2$, and the second layer is made of $Al_2O_3$. These layers are individually made amorphous by melt quench, and the resulting layers are bonded therebetween. Thereafter, a measurement is performed to find a time-varying change of distribution of mobile ions in the ion source layers 210 and 21, and in the resistance change layers 220 and 22 after erasing. The measurement is performed with an ensemble (statistical ensemble) being at the constant temperature and volume using Nose-Hoover heat bath, with the minimum time increment of 1 fs, and at the temperature of 1100 K for acceleration of a calculation time. The X-axis corresponds to the positions of the resistance change layers 220 and 22 and the ion source layers 210 and 21 of the memory elements 110 and 1, i.e., the range between 3 to 5 nm is for the positions of the resistance change layers 220 and 22, and the range between 5 to 8 nm is for the positions of the ion source layers 210 and 21. As for the resistance change layer 22 in the memory element 1, the range between 3 to 4 nm is for the position of the first layer 22A, and the range between 4 to 5 nm is for the position of the second layer 22B.

As is known from FIGS. 6A and 6B, with the previous memory element 110, the mobile ions 210a start diffusing into the resistance change layer 220 with a lapse of 4 or 5 ns immediately after erasing (initial). On the other hand, in the memory element 1, the diffusion of the mobile ions is stopped in the vicinity of 4 nm being the boundary between the first and second layers 22A and 22B. Through adjustment of the diffusion coefficient in the resistance change layer 22 as such, the mobile ions to be generated after erasing are controlled in diffusion speed, thereby favorably preventing any possible variations of resistance value among the memory elements 1.

Figure 7:
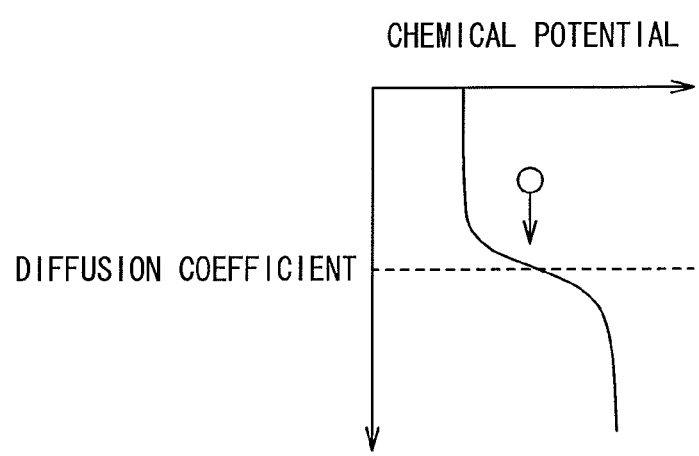
FIG. 7 is a diagram showing the relationship between a diffusion coefficient and a chemical potential in first and second layers.

Such control over the diffusion of the mobile ions from the ion source layer 21 into the resistance change layer 22 as such is also explainable using a chemical potential difference between the first and second layers 22A and 22B as shown in FIG. 7. The first and second layers 22A and 22B made of materials with different diffusion coefficients vary in chemical potential. The difference of diffusion coefficients and the difference of chemical potentials are not the same as the physical quantity, but have such a correlation therebetween as is expressed by the following equation 1. Generally, a material with a small diffusion coefficient is large in chemical potential, and a material with a large diffusion coefficient is small in chemical potential. As described above, since the diffusion of mobile ions is proportional to the gradient of a chemical potential, the mobile ions having been diffused from the ion source layer 21 to the second layer 22B are prevented from diffusing to the first layer 22A.

(Equation 1)

$$D = D_0 \exp(-\mu/kT) \quad \text{Equation 1}$$

(where D: Diffusion Coefficient, $D_0$: Self Diffusion Coefficient, μ: Chemical Potential, T: Temperature)

Moreover, with the configuration of including the first layer 22A made of a material with a small diffusion coefficient between the lower electrode 10 and the second layer 22B, the mobile ions are prevented from entering the first layer 22A at the time of writing, thereby favorably preventing any possible metallic bonding as a result of the positional closeness between the mobile ions and the lower electrode 10. This accordingly prevents the disadvantage that the mobile ions are left remained in the vicinity of the lower electrode 10 at the time of erasing.

Moreover, in the first layer 22A made of a material with a small diffusion coefficient, any thermal motion of the mobile ions is prevented. This accordingly eliminates any change of resistance value during the operation of the device. Such a change of resistance value adversely affects the operation of the device as random telegraph noise of resistance, but in the embodiment, such noise is possibly prevented.

As described above, in the memory element 1 of the embodiment, the resistance change layer 22 is in the two-layer structure including the first and second layers 22A and 22B, which are made of materials with different diffusion coefficients. Moreover, in the first layer 22A on the lower electrode 10 side, the mobile atoms have the smaller diffusion coefficient at the room temperature, i.e., $1.0 \times 1^{-21}$ m$^2$/s or smaller. This accordingly prevents any possible change of resistance as a result of the diffusion of mobile ions from the ion source layer 21 to the resistance change layer 22 after erasing. As a result, the resistance value is prevented from varying among the memory elements 1, thereby being able to improve the yield of a chip including a plurality of memory elements 1.

Furthermore, the resistance value at the time of erasing is possibly set to be low, thereby allowing the increase of a margin of the operation voltage. In other words, the characteristics of the device other than the electrical characteristics are to be optimized, e.g., the memory element possibly has the better life characteristics with a reduction of the erasing voltage. Moreover, the migration width of the mobile ions by diffusion is possibly reduced, thereby increasing the retention characteristics.

(Memory Device)

By arranging a plurality of memory elements 1 described above in rows or in a matrix, for example, a memory device (memory) is possibly configured. At this time, as appropriate, the memory elements 1 may be each connected with a MOS transistor for element selection use or with a diode to configure a memory cell. The resulting memory cells may be then each connected to a sense amplifier, an address decoder, circuits of writing, erasing, and reading, and others by wiring.

Figure 2:
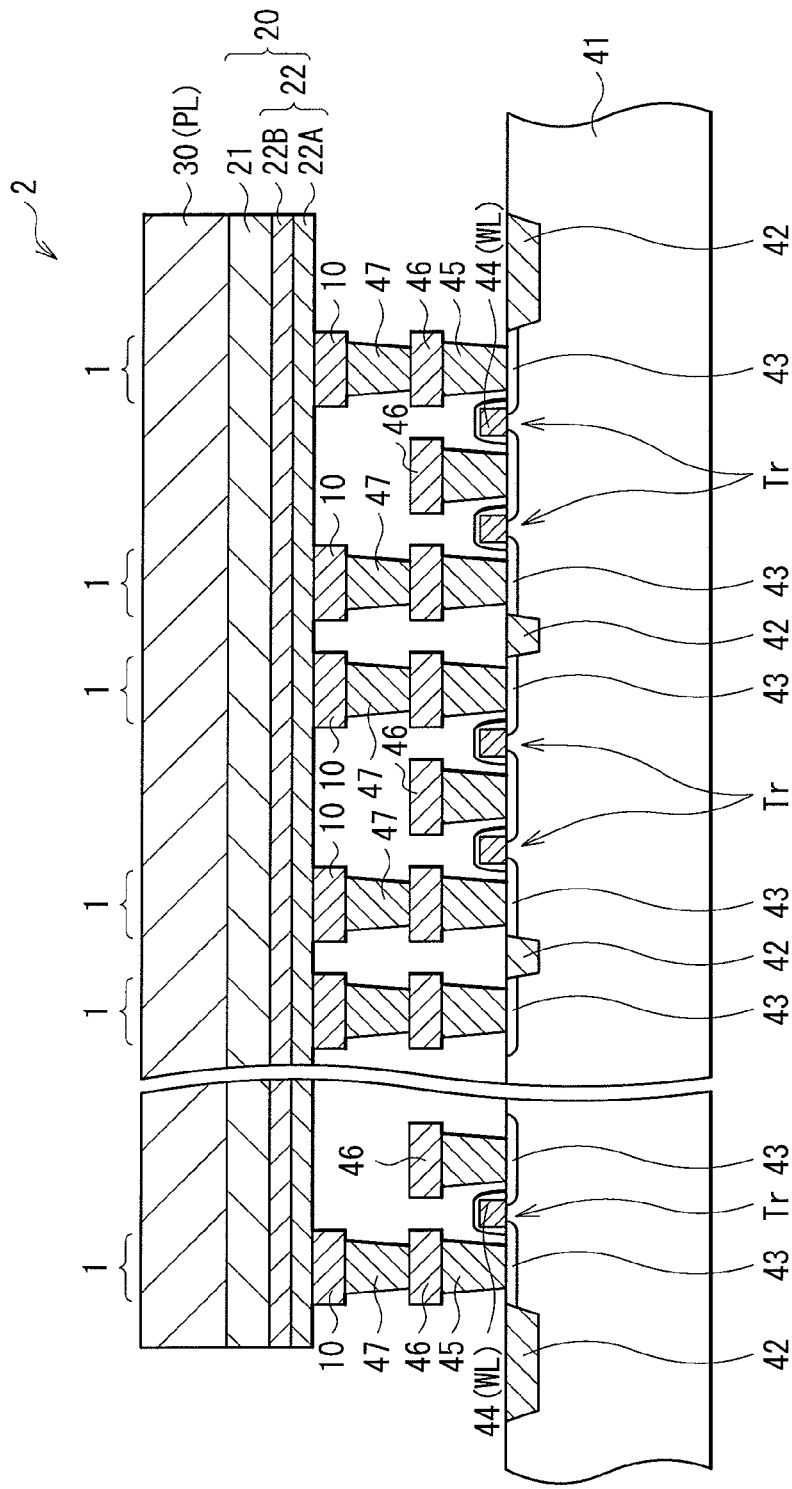
FIG. 2 is a cross-sectional view of a memory cell array using the memory element of FIG. 1, showing the configuration thereof.
Figure 3:
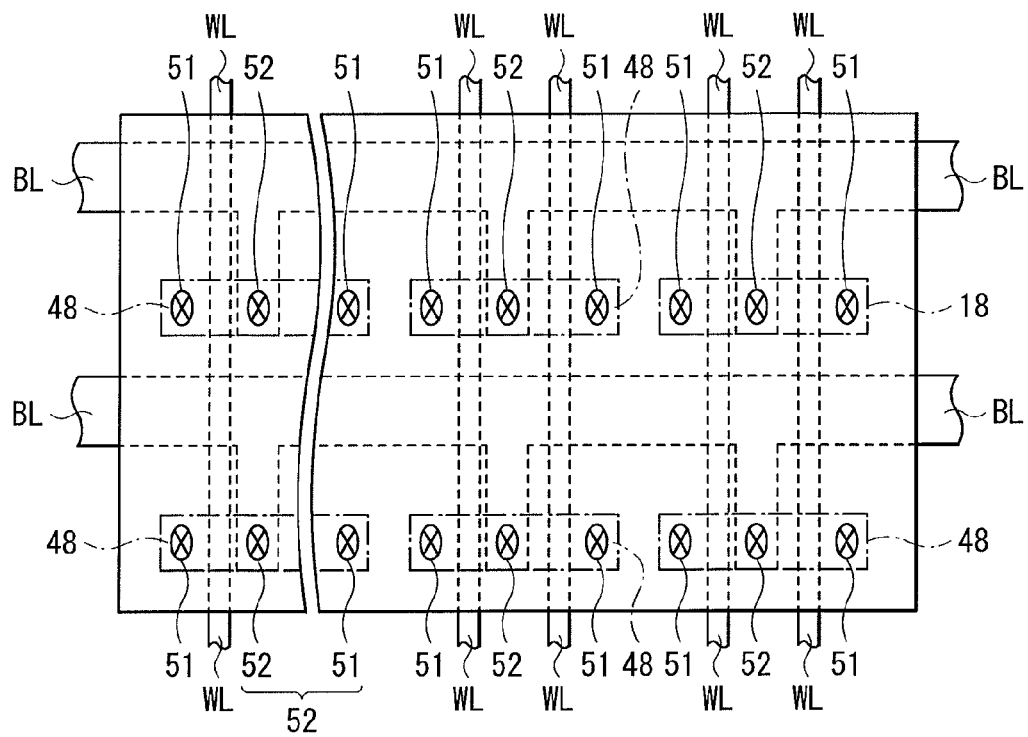
FIG. 3 is a plan view of the memory cell array of FIG. 2.

FIGS. 2 and 3 each show an exemplary memory device (memory cell array) including a plurality of memory elements 1 arranged in a matrix. FIG. 2 shows the cross-sectional configuration of the memory cell array, and FIG. 3 shows the configuration thereof in a planar view. In this memory cell array, to each of the memory elements 1, wiring for connection to the lower electrode 10 side thereof is so provided as to intersect wiring for connection to the upper electrode 30 side thereof, and at the respective intersection points, the memory element 1 is disposed.

The memory elements 1 all share the layers, i.e., the resistance change layer 22 (the first and second layers 22A and 22B), the ion source layer 21, and the upper electrode 30. In other words, these layers, i.e., the resistance change layer 22, the ion source layer 21, and the upper electrode 30, are each for the shared use by all of the memory elements 1 (are each one specific layer for use by all of the memory elements 1). The upper electrode 30 is a plate electrode PL for shared use by any adjacent cells.

On the other hand, the lower electrode 10 is provided individually to each of the memory cells so that the memory cells are electrically separated from one another. As such, the memory elements 1 in the memory cells are each defined by position to correspond to its lower electrode 10. The lower electrodes 10 are each connected to its corresponding MOS transistor Tr for cell selection use, and the memory elements 1 are each disposed above its corresponding MOS transistor Tr.

The MOS transistor Tr is configured by source/drain regions 43, and a gate electrode 44, which are formed in a region separated by an element separation layer 42 in the substrate 41. The gate electrode 44 is formed, on the wall surface, with a side wall insulation layer. The gate electrode 44 serves also as a word line WL, which is one of two pieces of address wiring for the memory element 1. One of the source/drain regions 43 of the MOS transistor Tr is electrically connected to the lower electrode 10 of the memory element 1 via various layers, i.e., a plug layer 45, a metal wiring layer 46, and a plug layer 47. The other of the source/drain regions 43 of the MOS transistor Tr is connected to the metal wiring layer 46 via the plug layer 45. The metal wiring layer 46 is connected to a bit line BL (refer to FIG. 3), which is the remaining piece of address wiring for the memory element 1. Note that, in FIG. 3, an active region 48 of the MOS transistor Tr is indicated by alternate long and short dashed lines. In the active region 48, contact sections 51 are connected to the lower electrode 10 of the memory element 1, and contact sections 52 are connected to the bit line BL.

In such a memory cell array, when a voltage is applied to the bit lines BL with the gate of the MOS transistor Tr turned ON by the word line WL, the voltage is directed to the lower electrode 10 of the selected memory cell via the source/drain of the MOS transistor Tr. In this example, as for the voltage applied to the lower electrode 10, when the polarity thereof is at a negative potential compared with the potential of the upper electrode 30 (the plate electrode PL), the resistance value of the memory element 1 is changed in state to low resistance as described above, whereby the selected memory cell is written with information. Next, when the potential of the voltage applied this time to the lower electrode 10 is positive compared with the potential of the upper electrode 30 (the plate electrode PL), the resistance value of the memory element 1 is changed in state again to high resistance, whereby the information written to the selected memory cell is erased. For reading of the written information, for example, a selection of memory cell is made by the MOS transistor Tr, and with respect to the selected memory cell, a predetermined level of voltage or current is applied. The current or voltage varying in level based on the resistance state of the memory element 1 at this time is detected via a sense amplifier or others connected to the tip of the bit line BL or of the plate electrode PL. Herein, the voltage or current for application to the selected memory cell is set to be smaller than the threshold value of the voltage or others at which the memory element 1 shows a change of resistance value.

The memory device of this embodiment is applicable to various types of memory devices as described above. For example, the memory device is applicable for use with any types of memories such as once-writable PROM, electrically erasable EEPROM, or so-called RAM available for high-speed writing, erasing, and reproduction.

While the present disclosure has been described in detail, the foregoing description is in all aspects illustrative and not restrictive. It is understood that numerous other modifications and variations are to be possibly devised. For example, in the embodiment described above, the resistance change layer is configured by two layers varying in diffusion coefficient, but alternatively, may be in the structure of three or more layers.

Moreover, in the embodiment described above, for example, the configuration of the memory element 1, and that of the memory cell array are specifically described. However, all of the layers are not necessarily provided, or any other layers may be also provided.

Furthermore, for example, the materials of the layers, the film-forming methods and conditions, and others described in the embodiment above are surely not restrictive, and any other materials, or any other film-forming methods will also do. For example, the ion source layer 21 may be added with any other transition metallic elements, e.g., Ti, Hf, V, Nb, Ta, Cr, Mo, or W as long as the composition ratio described above remains intact. Moreover, other than Cu, Ag, and zinc (Zn), nickel (Ni) or others may be also added.

The present disclosure contains subject matter related to that disclosed in Japanese Priority Patent Application JP 2010-208466 filed in the Japan Patent Office on Sep. 16, 2010, the entire content of which is hereby incorporated by reference.

What is claimed is:

1. A memory element, comprising:
a first electrode, a memory layer, and a second electrode in this order,
wherein,
the memory layer includes (a) a resistance change layer comprising at least a first layer and a second layer, the first and second layers having different diffusion coefficients of mobile ions, and (b) an ion source layer disposed between the resistance change layer and the second electrode, and
the second layer is between the first layer and the ion source layer, the second layer comprising one or more of oxygen (O), tellurium (Te), sulfur (S), and selenium (Se).

2. The memory element according to claim 1, wherein:
the diffusion coefficient of the mobile ions in the first layer at room temperature is $1.0 \times 10^{21}$ m$^2$/s or smaller.

3. The memory element according to claim 2, wherein the first layer includes one or more of silicon (Si), aluminum (Al), nickel (Ni), palladium (Pd), manganese (Mn), iron (Fe), cobalt (Co), calcium (Ca), magnesium (Mg), gadolinium (Gd), zinc (Zn), titanium (Ti), zirconium (Zr), hafnium (Hf), vanadium (V), niobium (Nb), tantalum (Ta), chromium (Cr), molybdenum (Mo), tungsten (W), and lanthanum (La), and includes one or more of oxygen (O), tellurium (Te), sulfur (S), and selenium (Se).

4. The memory element according to claim 1, wherein by voltage application to the first and second electrodes, a low-resistance section is formed by migration of mobile ions included in the ion source layer into the resistance change layer, and the resistance change layer shows a change of a resistance value.

5. The memory element according to claim 4, wherein:
among the mobile ions moved to the resistance change layer, mobile ions in the first layer have a chemical potential higher than that of mobile ions in the second layer.

6. The memory element according to claim 1, wherein the ion source layer includes one or more of copper (Cu), silver (Ag), zinc (Zn), and aluminum (Al).

7. A memory element, comprising:
a first electrode, a memory layer, and a second electrode in this order,
wherein,
the memory layer includes a resistance change layer including a plurality of layers varying in diffusion coefficient of mobile ions, and an ion source layer disposed between the resistance change layer and the second electrode, the resistance change layer includes a first layer on a first electrode side, and a second layer between the first layer and the ion source layer, the diffusion coefficient of the mobile ions in the first layer at room temperature is $1.0 \times 10^{21}$ m$^2$/s or smaller, and the second layer includes one or more of silicon (Si), aluminum (Al), nickel (Ni), palladium (Pd), manganese (Mn), iron (Fe), cobalt (Co), calcium (Ca), magnesium (Mg), gadolinium (Gd), zinc (Zn), titanium (Ti), zirconium (Zr), hafnium (Hf), vanadium (V), niobium (Nb), tantalum (Ta), chromium (Cr), molybdenum (Mo), tungsten (W), and lanthanum (La), and includes one or more of oxygen (O), tellurium (Te), sulfur (S), and selenium (Se).

8. A memory device, comprising:

a plurality of memory elements each including a first electrode, a memory layer, and a second electrode in this order; and a pulse application section applying a voltage or current pulse selectively to the memory elements, wherein, the memory layer includes (a) a resistance change layer comprising at least a first layer and a second layer, the first and second layers having different diffusion coefficients of mobile ions, and (b) an ion source layer disposed between the resistance change layer and the second electrode, and the second layer is between the first layer and the ion source layer, the second layer comprising one or more of oxygen (O), tellurium (Te), sulfur (S), and selenium (Se).

* * * * *